(12) United States Patent
Reime (10) Patent No.: US 8,334,623 B2
(45) Date of Patent: Dec. 18, 2012

(54) CAPACITIVE MOISTURE INDEPENDENT CRUSH PROTECTION

(76) Inventor: Gerd Reime, Buhl (DE)

( * ) Notice: Subject to any disclaimer, the term of this patent is extended or adjusted under 35 U.S.C. 154(b) by 632 days.

(21) Appl. No.: 12/358,307

(22) Filed: Jan. 23, 2009

(65) Prior Publication Data

US 2009/0212849 A1 Aug. 27, 2009

(30) Foreign Application Priority Data

Jan. 23, 2008 (DE) .......................... 10 2008 005 783

(51) Int. Cl.
*H03K 17/945* (2006.01)
(52) U.S. Cl. ........................................... 307/326; 49/28
(58) Field of Classification Search .................. 307/326; 49/26–28; 200/61.42, 61.43
See application file for complete search history.

(56) References Cited

U.S. PATENT DOCUMENTS

| | | | | |
|---|---|---|---|---|
| 5,051,671 | A * | 9/1991 | Crider et al. .................. | 318/466 |
| 5,952,835 | A * | 9/1999 | Coveley ........................ | 324/671 |
| 6,271,512 | B1 * | 8/2001 | Lewis ........................... | 250/221 |
| 6,515,441 | B1 * | 2/2003 | Tyckowski et al. ........... | 318/445 |
| 6,925,755 | B1 * | 8/2005 | Kyrtsos ......................... | 49/26 |
| 7,293,467 | B2 * | 11/2007 | Shank et al. ................... | 73/780 |
| 2002/0154039 | A1 | 10/2002 | Lambert | |
| 2005/0179415 | A1 | 8/2005 | Nakano | |

FOREIGN PATENT DOCUMENTS

| | | |
|---|---|---|
| CH | 661391 | 3/1982 |
| DE | 19632592 | 8/1996 |
| EP | 1154110 | 11/2001 |
| EP | 1455044 | 9/2004 |
| EP | 0706648 | 1/2009 |
| GB | 2401974 | * 2/2003 |

OTHER PUBLICATIONS

International Search Report PCT/EP2009/000372; Dated Jun. 24, 2009.

* cited by examiner

*Primary Examiner* — Fritz M Fleming
(74) *Attorney, Agent, or Firm* — Cantor Colburn LLP (57) ABSTRACT

A protective arrangement for preventing parts of the body from being trapped between at least two mutually relatively moveable parts including at least one strip which is associated with at least one part. There are provided in the strip at least two mutually spaced conductive elements extending in the longitudinal direction of the strip. An electronic sensor system serves to produce an output signal for a capacitance that is adapted to vary as a result of external influences. Due to the fact that at least one first conductive element sends out a signal which is received by at least one second conductive element due to the capacitive effect of the first conductive element and that the second conductive element is at substantially the same electrical potential as the first conductive element and likewise sends out the received signal, there is provided a capacitive crush protection arrangement which does not react to splashes of water or the formation of dew or frost.

28 Claims, 8 Drawing Sheets

CAPACITIVE MOISTURE INDEPENDENT CRUSH PROTECTION

CROSS-REFERENCE TO RELATED APPLICATIONS

The present application claims the priority of the German Patent Application 10 2008 005 783.5 which was filed on 23 Jan. 2008, the entire content thereof being herein incorporated by reference.

TECHNICAL FIELD OF THE INVENTION

The invention relates to a method for crush protection as well as an appertaining crush protection arrangement.

BRIEF DESCRIPTION OF RELATED ART

In the industrial and automobile field, trapping prevention systems such as those in accordance with DE 196 32 592 C2 or EP 1 154 110 A2 for example are often implemented by means of so-called contact rails or safety strips. These are generally flexible rubber or plastic strips which comprise two oppositely located conductive elements. Should these strips be compressed in the event of something being trapped, the conductive elements come into contact and e.g. the drive motor of a mechanically moved part is thereby reversed. These tactile safety strips are employed on e.g. rotating or sliding doors or else with e.g. automatically closing windows or sun roofs in the automobile field. A part of the body located in the region of closure thus needs to be recognized so that it is not trapped in the course of an automatic closing process. In the case of the safety strips described above, a certain amount of pressure must be exerted by the body part on this strip in order to stop or reverse a drive motor.

The usual materials used for these tactile safety strips are often temperature-dependent i.e. a greater amount of pressure is required to close the contact when the temperature is low in winter than is needed at the higher temperatures occurring in summer. Consequently, the pressure needed for reversing e.g. a car window is often too great for a child's small finger so that there is then an acute danger of injury.

Figure 1:
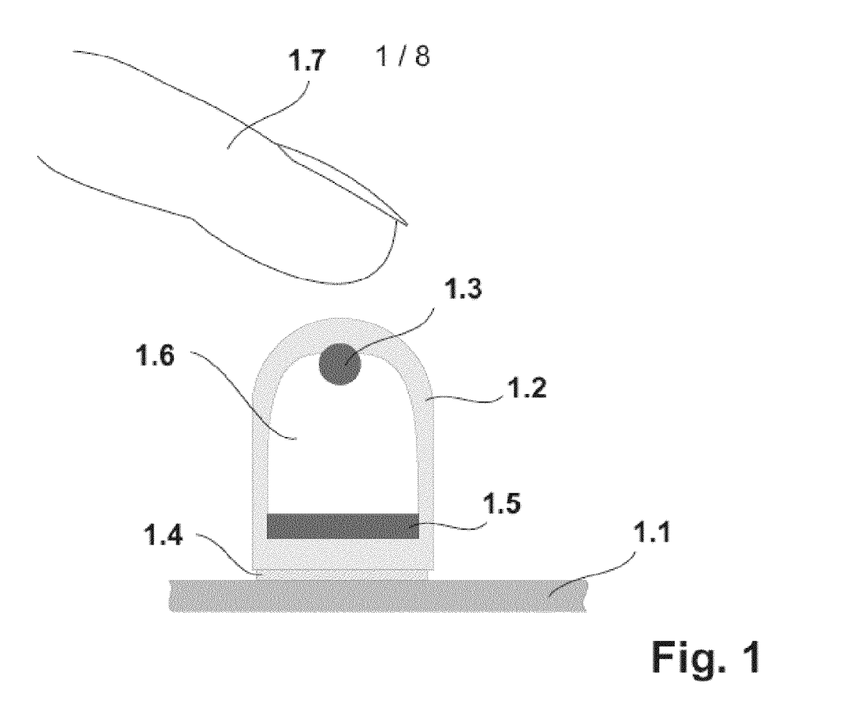
FIGS. 1, 2 show a tactile safety strip in accord with the state of the art in the form of a sectional and perspective view, FIG. 3 an arrangement consisting of two mutually relatively moveable safety strips in accordance with the invention, FIG. 4 an arrangement in accordance with FIG. 3 wherein a safety strip is replaced by a thin conductive planar element, FIG. 5 a block circuit diagram of a circuit for detecting capacitive changes in the safety strip, FIG. 6 a block circuit diagram in accordance with FIG. 5 in which the summation resistances are replaced by impedance converters, FIG. 7 a block circuit diagram in accordance with FIG. 5 incorporating a circuit for monitoring the safety strip for mechanical damage, FIG. 8 a block circuit diagram in accordance with FIG. 5 in the case of a solution in accordance with FIG. 4, FIG. 9 the control value for the exemplary embodiment of FIG. 5 without and during the approach of a hand, FIG. 10 a safety strip in accordance with the invention in the form of a sectional view illustrating the lines of flux in a greatly simplified manner, FIG. 11 an illustration in accordance with FIG. 10 having drops of water or a film of moisture on the surface of the safety strip.

A further development of these safety strips is provided by a so-called capacitive trapping prevention arrangement. A rubber or plastic strip similar to the device described above is provided with appropriate electrodes as is illustrated in FIG. 1 for example. These react to the change of capacitance occurring when a part of the body e.g. a finger comes near. The reason for this change in capacitance is the electrically conductive water component in the human body. The disadvantage here, is that these systems thus react not only to the approach of an e.g. hand, but also to splashes of water or the formation of dew or frost.

In addition, a major phenomenon affecting the previous systems is the capacitance between the second conductive element 1.3 and a supporting surface 1.1 made of metal or a synthetic material such as the chassis of a vehicle for example. Consequently, various methods have been tried for reducing the capacitance between the second conductive element 1.3 and the supporting surface 1.1 acting as an earth by connecting up the first conductive element 1.5 such as to form a so-called "active ground". To this end, the signal occurring on the second conductive element 1.3 is tapped-off via a high impedance connection and applied via a low impedance buffer stage to the first conductive element 1.5. This indeed reduces the capacitance between the second conductive element 1.3 and the earthed surface 1.1, but offers no substantial help in countering the effects of moisture.

From CH 661 391 A5, there is known a capacitive sensor wherein a signal is transferred from a first electrode via a capacitive coupling to a further electrode which is located closer to another object that is to be detected than the first electrode, said further electrode sending out the signal and, in turn, transferring the signal via a capacitive coupling to a third electrode which is located at the same distance from the object that is to be detected as the first electrode and which passes this signal on to the evaluation circuit.

From EP 1 455 044 A2, there is known a trapping prevention arrangement comprising two mutually relatively moveable conductive elements wherein, apart from the capacitive measuring signals occurring in response to external influences, an additional measured variable is also obtained by means of the formation of a contact.

BRIEF SUMMARY OF THE INVENTION

On the basis of this state of the art, the invention provides a capacitive crush protection arrangement which does not react to splashes of water, or the formation of dew or frost.

In the case of the invention described, the detection sensitivity of the arrangement e.g. its response to the approach of someone's hand, does not decrease even in the presence of drops of water on the surface of the safety strip. Due to the fact that both conductive elements in a strip are at substantially the same potential, so too are the receiving element and the emitting element and the same applies to drops of water located on the exterior of the strip. But nevertheless, external influences can be reliably detected as changes in the capacitance due to the ability to detect even the smallest possible alterations in the value thereof.

Advantageously, the tactile safety strips employed up to now can still be used, whereby the approach of a hand is then detected capacitively at a certain distance of e.g. 50 mm away from the strip, whereas the introduction of a non-conductive and non-capacitively effective object is still recognized in a tactile manner i.e. by virtue of the mechanical compression and the resultant contact of the conductive sectors. If, however, one dispenses with the tactile security aspect, the safety strip can also be implemented as a compact element i.e. without a cavity.

Further advantages are apparent from the subordinate Claims and the following description of preferred exemplary embodiments.

BRIEF DESCRIPTION OF THE FIGURES

The invention is explained in more detail hereinafter on the basis of exemplary embodiments that are illustrated in the accompanying Figures. Therein.

DETAILED DESCRIPTION OF PREFERRED EXEMPLARY EMBODIMENTS

Before the invention is described in detail, it should be pointed out that it is not restricted to the particular components of the device or to the particular method steps since these components and methods can vary. The terms being used here are only intended to describe special embodiments and are not used in any restricted sense. If, in addition, the singular or indefinite articles are used in the description or in the Claims, these also include a plurality of these elements insofar as the general context does not make it unambiguously clear that something else is intended.

The invention will now be explained in more detail in exemplary manner taken with reference to the accompanying drawings. However, the exemplary embodiments are merely examples which are not intended to limit the inventive concept to a certain arrangement.

In the context of this application, the terms "low impedance" and "high impedance" are used. A low impedance connection is present if the trapping prevention arrangement is connected via a resistance or a resistance network and the capacitance of the trapping prevention arrangement with respect to earth arising thereby amounts to 80 pF for example, so that the signal present beyond the resistance or the resistance network is reduced to such an extent that no effect thereof is apparent. The approach of a hand producing a change of e.g. 1 pF is then ineffective in the output signal. High impedance means that a signal which is sent via this resistance or this resistance network experiences a change (being reduced by an RC low-pass filter for example) that can be unambiguously detected and produces a measurable change in the measuring signal. Following this definition in a concrete case, a low impedance connection is present within a range of <200 ohms, whereas a high impedance connection is present in the case of a resistance >50 kOhm. Between these values, effects for both of the scenarios described can be determined.

Figure 2:
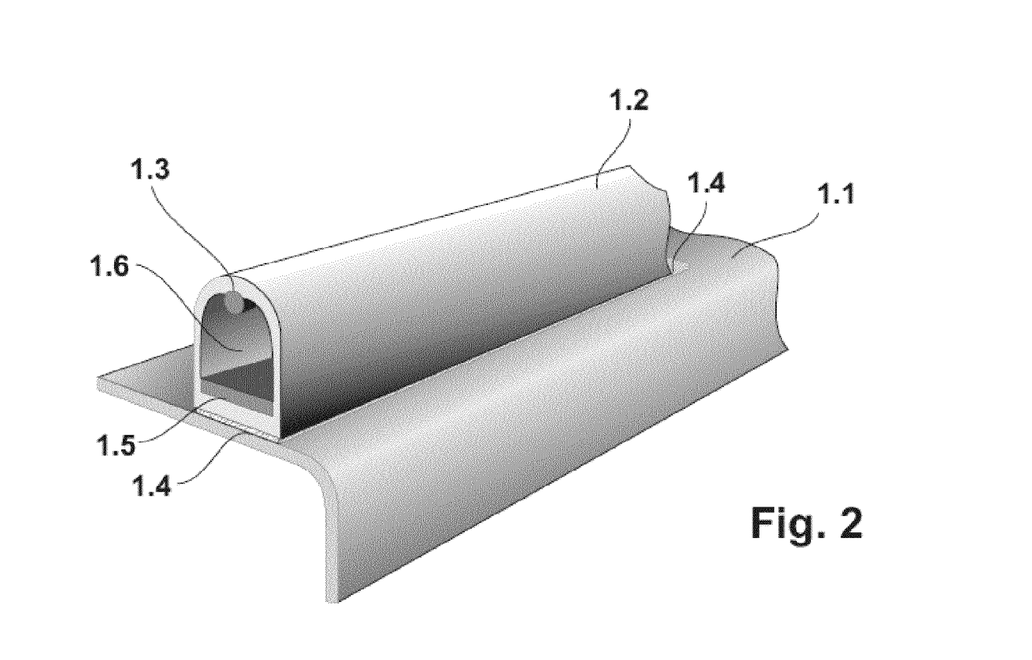

FIGS. 1, 2 show a tactile safety strip in the form of a cross-sectional and perspective view. A commercially available safety strip is located on a supporting surface 1.1 made of metal or a synthetic material which may be the e.g. metallic chassis of an automobile. As a rule, the safety strip is fixed to the chassis by means of an adhesive layer 1.4. Two electrically conductive elements, the first conductive element 1.5 and the second conductive element 1.3, are located within the non conductive rubber body 1.2. The cavity 1.6 isolates the conductive elements 1.5 and 1.3 in normal circumstances. Pressure on the upper edge of this strip deforms it in a manner such that the two elements 1.5 and 1.3 touch one another and form an electrical contact. An electronic circuit evaluates this contact and reverses e.g. a drive motor.

Figure 12:
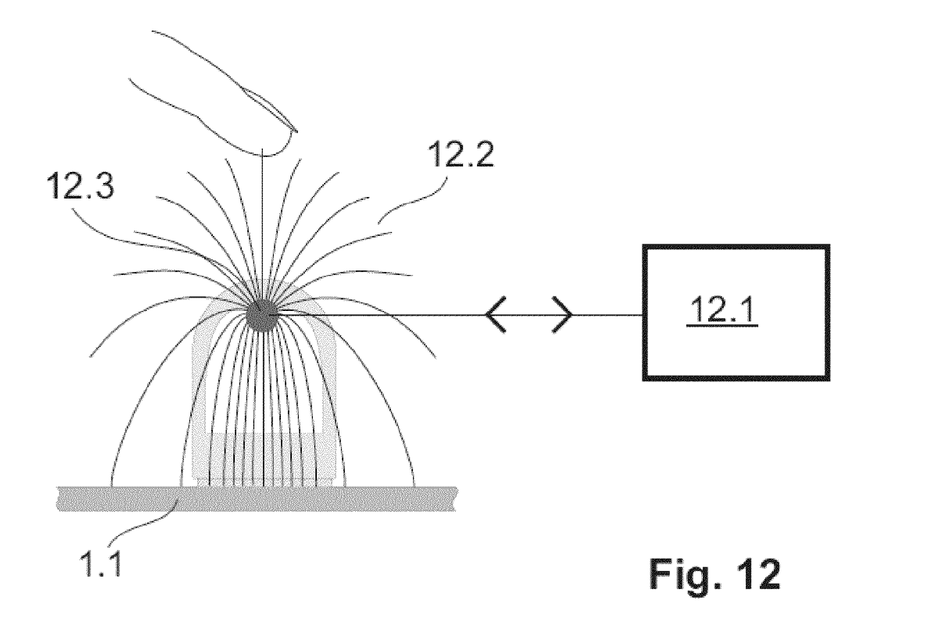
FIG. 12 a safety strip in the form of a sectional view in accord with the state of the art illustrating the lines of flux of the emitting element in greatly simplified manner, FIG. 13 an illustration in accordance with FIG. 12 having drops of water or a film of moisture on the surface of the safety strip, FIG. 14 a block circuit diagram in accordance with FIG. 5, wherein the safety strip is coupled by means of voltage dividers.

Of course, previous capacitive systems could also use the conductive elements 1.3 and 1.5 of a safety strip for detecting the approach of a hand. However, a comparison between previous capacitive measuring systems for recognizing the approach of a hand and the invention presented here will fully clarify the manner of functioning and the substantial advantage of the new invention:

In the case of the previous capacitive sensors, an electrically conductive element 12.3 is directly connected to an appropriate electronic sensor system 12.1 (FIG. 12). This, for example, causes a certain amount of electricity to flow via a resistance directly into the conductive element 12.3 and then determines the voltage thereon. If the capacitance of the surroundings changes, then the voltage on the emitting element 12.3 also changes. FIG. 12 shows in greatly simplified manner the lines of flux 12.2 of the emitting element 12.3 which occur in such a system.

Figure 13:
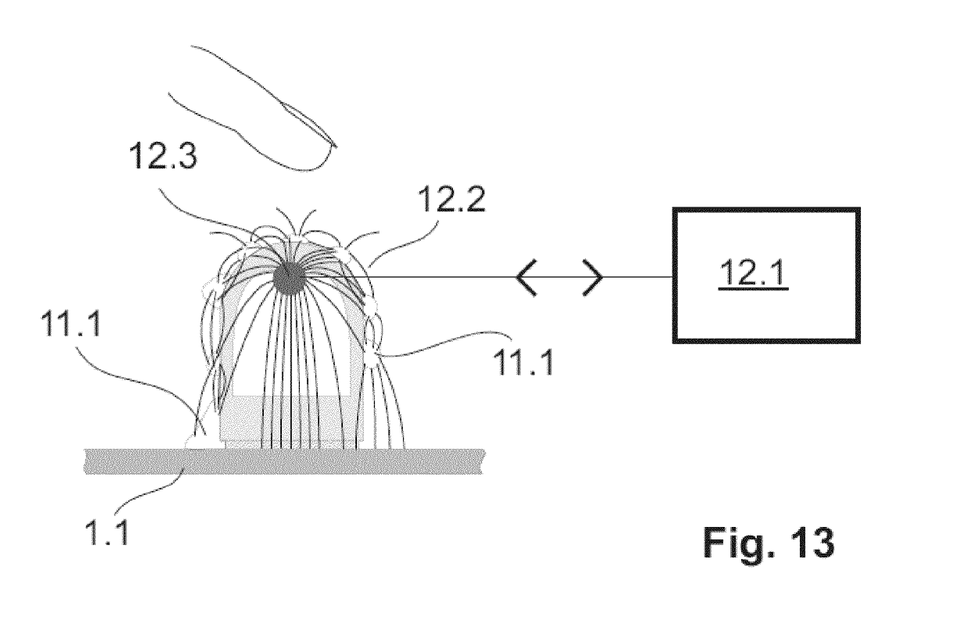

FIG. 13 shows in simplified form that drops of water 11.1 or a film of moisture on the surface of the safety strip between the element 12.3 and the supporting surface 1.1 e.g. the chassis of an automobile alter the capacitance to a considerable extent so that the water film acts as a significant source of interference. To a substantial extent, the lines of flux 12.2 are diverted directly towards the supporting surface 1.1 via a path extending from water drop to water drop 11.1. The detection sensitivity of the arrangement decreases sharply in this case.

The capacitance between the second conductive element 1.3 and the supporting surface 1.1 consisting of a metal or synthetic material e.g. the chassis of a vehicle also manifested itself to a substantial extent in the previous systems. Various methods therefore tried to reduce the capacitance between the second conductive element 1.3 and the supporting surface 1.1 acting as an earth by connecting up the first conductive element 1.5 to act as a so-called "active ground". To this end, the signal on the second conductive element 1.3 was tapped off in high impedance manner and applied via a low impedance buffer to the first conductive element 1.5. This did of course reduce the capacitance between the second conductive element 1.3 and the supporting surface 1.1, but did not substantially help to counter the effects of moisture.

The invention being presented here also uses such a safety strip as its basic element. The invention is not however restricted to this arrangement, different arrangements of the conductive electrical elements also being possible.

Hereby, one proceeds from the following considerations: an electrical alternating signal of 70 kHz for example is applied to the first conductive element 1.5. The shape of the first conductive element 1.5 is preferably planar in accordance with FIG. 1. The signal can be a rectangular or sinusoidal signal but could also be just in the form of a pulse. The type of signal is of no consequence, it need only be capable of being appropriately evaluated by the following electronic system. Accordingly, the driver stage for the electrical signal should be of low impedance so that capacitances between the first conductive element 1.5 and the supporting surface 1.1 will not manifest themselves. Virtually the same signal as that at the emitting first conductive element 1.5 appears in the second conductive element 1.3 due to the capacitive effect between the first conductive element 1.5 and the second conductive element 1.3.

A direct earthing effect between the second conductive element 1.3 and the supporting surface 1.1 does not arise due to the first conductive active drive element 1.5 located therebetween. It is only the capacitance with respect to the surrounding air or any conductive surfaces e.g. parts of the chassis of a vehicle that are located in the vicinity of the safety strip, but not those lying under or in close proximity to the conductive surfaces of the first conductive element 1.5, that comes into consideration. However, as these surfaces are generally located at greater distances from the second conductive element 1.3 than a hand 1.7 that is to be detected, they are scarcely relevant.

Figure 10:
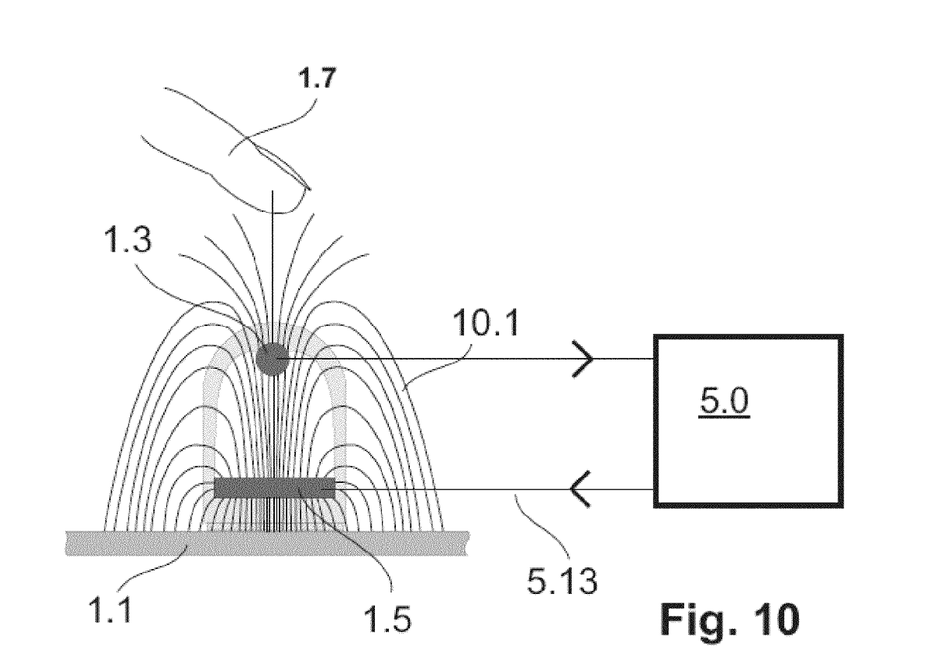
Figure 11:
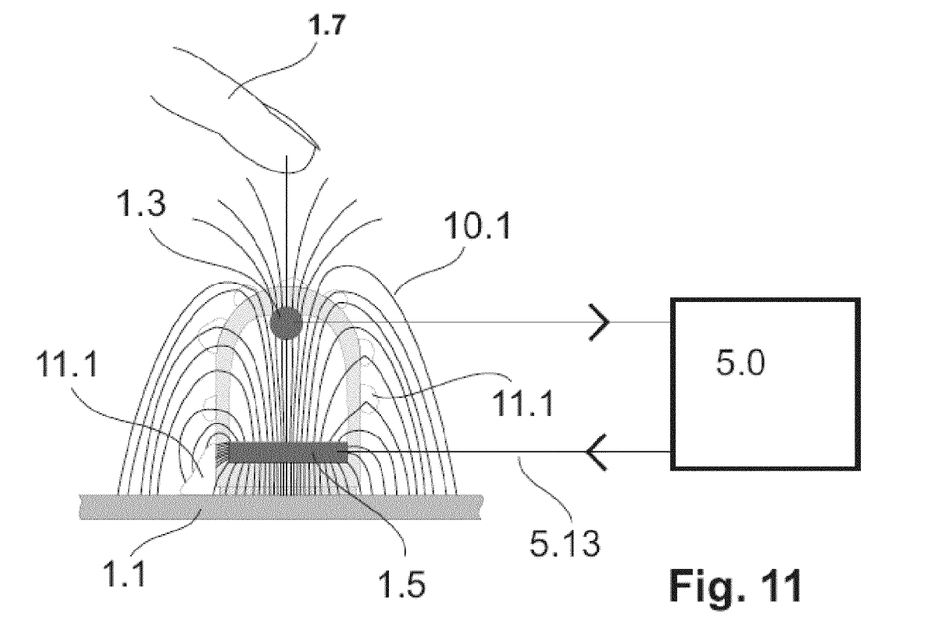

FIG. 10 clarifies the mode of operation. The lines of flux 10.1 outgoing from the first conductive element 1.5 are illustrated in a greatly simplified manner. One portion of the lines of flux of the clock signal 5.13 impinges on the second conductive element 1.3. Since this element does not have any substantial form of connection to a further potential e.g. the surrounding earthed surface, virtually the same signal voltage as that occurring in the emitting first conductive element 1.5 is built up therein. Consequently, in turn, the second conductive element 1.3 also becomes a radiating element. In accordance with FIG. 11, drops of water 11.1 on the surface of the safety strip receive the lines of flux 10.1 in similar manner to the element 1.3 and in turn form a radiating element. In consequence, there is no reduction of the clock signal voltage on the element 1.3 in the presence of moisture and rain drops.

An approaching hand however alters the capacitance of the second conductive element 1.3 relative to a reference potential, e.g. the surrounding earthed surface. Consequently, the voltage level of the received clock signal 5.13 in the second conductive element 1.3 also changes, this being something which can then be evaluated by means of a suitable electronic system. The result in practice was that when the surface was extensively wetted by rain drops having a coverage of 50% there was no effect on the voltage of the clock signal in the second conductive element 1.3. There was equally little effect when the surface was wetted by the formation of dew or frost. In every case, the approach of a hand was detectable at a distance of 50 mm with the aid of a suitable electronic evaluation system.

This thus results in a method for preventing objects or parts of the body 1.7 from being trapped between at least two mutually relatively moveable parts of which at least one part 1.1, 3.1 has at least one strip 1.2, 3.2 associated therewith. The strip comprises at least two mutually spaced conductive elements 1.3, 1.5 which extend in the longitudinal direction of the strip and both of which are arranged in the strip. It is thereby ensured that changes in capacitance caused by external influences or the presence of an object (i.e., a body part 1.7) can be picked up by an electronic sensor system 5.0 in order to produce an output signal 5.16 as a result of any changes in the mutual relationship between the conductive elements. The at least one first conductive element 1.5 emits a signal which is received by at least one second conductive element 1.3 due to the capacitive effect of the first conductive element 1.5, said second conductive element being at substantially the same electrical potential as the first conductive element 1.5 and likewise emitting the received signal.

The HALIOS method for the production of the safety strip in accordance with EP 706 648 B1 that has been integrated into FIGS. 5-8 has turned out to be ideal for the realization of the invention described above. It serves here as an exemplary embodiment of a sensitive electronic sensor system 5.0 for a capacitive safety strip.

FIGS. 5 to 8 clarify the manner of operation. A clock generator 5.8 supplies a first clock signal 5.13 to a first amplitude regulator 5.10 and a second inverted clock signal 5.12 to a second amplitude regulator 5.9. The low impedance output of the first amplitude regulator 5.10 is connected to the first conductive element 1.5. The latter transmits the first clock signal 5.13 to the conductive element 1.3 due to capacitive effects. The signal on the conductive element 1.3 is passed to the input of the alternating voltage amplifier 5.5 via the high impedance summation resistance 5.4. The second clock signal 5.12 which is inverted with respect to the first clock signal 5.13 is passed via the second amplitude regulator 5.9 to the series reference capacitor 5.1 and via a second high impedance summation resistance 5.2 to the input of the alternating voltage amplifier 5.5. The series reference capacitor 5.1 should be of approximately the same size as the mutual capacitance of the conductive elements 1.5 and 1.3. Any mutual capacitance of the first conductive element 1.3 with respect to its surroundings e.g. the chassis of a vehicle, can be compensated by the parallel condenser 5.3. The summation resistances 5.2 and 5.4 should preferably be of high impedance and exhibit the same values.

Figure 5:
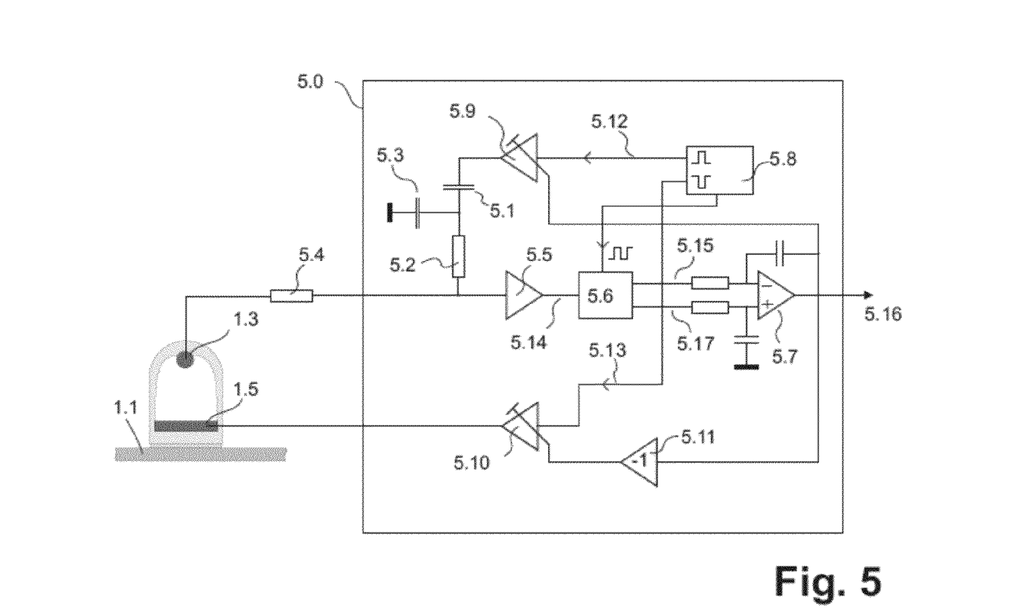
Figure 6:
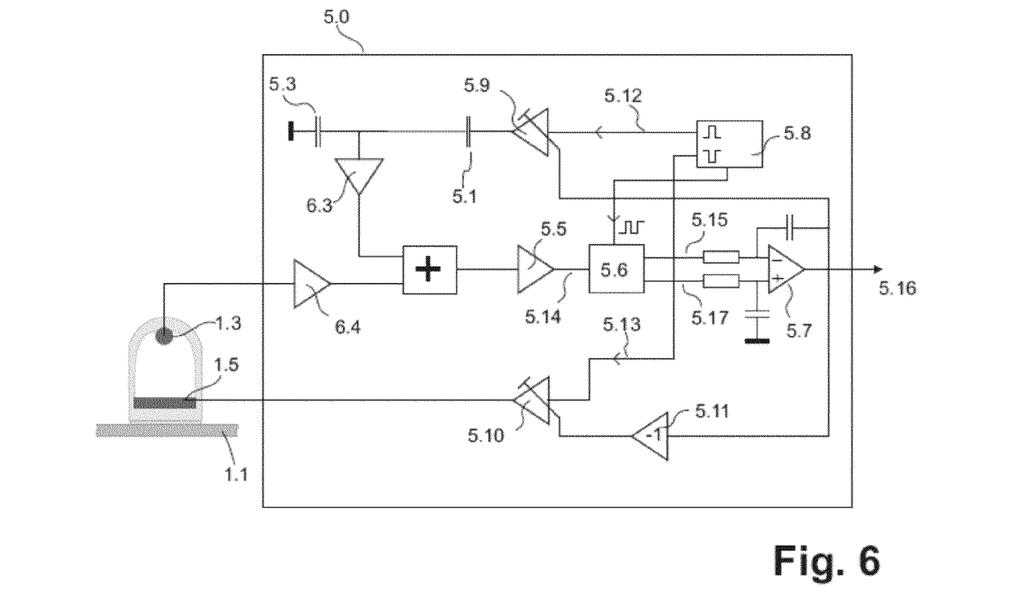

By virtue of a corresponding amplitude regulation process, the previously summed clock signals 5.12 and 5.13 cancel one another at the input of the amplifier 5.5 which is preferably in the form of an alternating voltage amplifier. Since, in the ideal case, the amplifier 5.5 merely sees noise at the input thereof after the mutual cancellation of the clocks, it can amplify to a very high degree or be implemented in the form of a high-amplification limiter amplifier.

The output signal 5.14 of the amplifier 5.5 is supplied to the synchronous demodulator 5.6. The output signals of the synchronous demodulator 5.6 which can be associated with the two clock signals 5.12 and 5.13 are examined for differences in amplitude by the integrating comparator 5.7. The comparator can be implemented as a high amplification comparator circuit. Any deviation of the input voltages 5.15 and 5.17 no matter how small leads to a corresponding deviation of the control value 5.16 from its momentary value. The amplitude regulators 5.9 and 5.10 are controlled by the control value 5.16 in a mutually inverted manner by means of the inverter stage 5.11. If the output amplitude of one amplitude regulator rises, then that of the other drops accordingly. Consequently, the input signal of the alternating voltage amplifier 5.5 is kept constant at "zero" i.e. no clock synchronous signal components of any sort are contained therein.

If, for example, a hand approaches the safety strip, then the capacitance of the second conductive element 1.3 with respect to its surroundings changes. This additional capacitance together with the capacitance between the conductive elements 1.5 and 1.3 works in a manner similar to a capacitive voltage divider and the voltage on the element 1.3 decreases accordingly. This decrease leads to an incomplete cancellation of the clock signals 5.12 and 5.13 at the input of the amplifier 5.5. This in turn leads to a deviation of the control value 5.16 following the synchronous demodulation process in the synchronous demodulator 5.6 and the process of evaluation of the deviation of the differences in the separated signal components of the input voltages 5.15 and 5.17.

Figure 9:
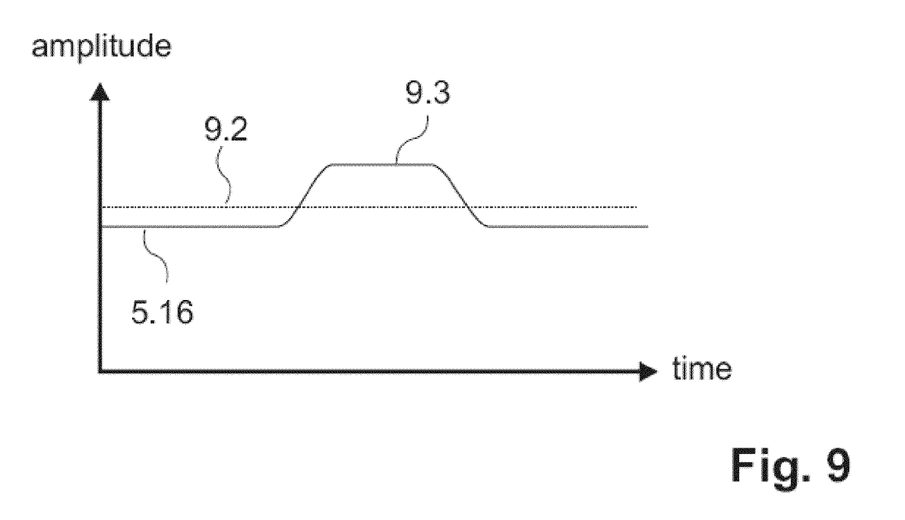

FIG. 9 shows the control value 5.16 for the exemplary embodiment of FIG. 5 in the case where a hand is not approaching. If a hand does approach, the control value 5.16 changes to a higher control value 9.3. The deviation in the control value 5.16 will rise or fall with respect to its previous value until such time as the clock signal 5.13 and the inverted clock signal 5.12 have fully cancelled each other out again at the input of the alternating voltage amplifier 5.5.

In the exemplary embodiment, the control value rises when a hand approaches. An evaluating logic which is not illustrated pictorially here can then undertake an evaluation of the control value 5.16 e.g. by means of a threshold value 9.2. If the threshold value 9.2 is exceeded, this is considered as being a "trapping risk" and a mechanical movement can be stopped or reversed accordingly.

In this arrangement, an approach towards a safety strip or the placing of any capacitively effective object upon a safety strip can be detected.

Moreover, the summation resistances 5.2 and 5.4 described in the exemplary embodiment could also be replaced by condensers or series circuits consisting of resistances and condensers. Advantageously, the summation resistances 5.2 and 5.4 could, in accordance with FIG. 6, also be implemented by means of impedance converters 6.3 and 6.4 having high impedance inputs. The information signal on the second conductive element 1.3 is not loaded by the active circuitry.

Figure 7:
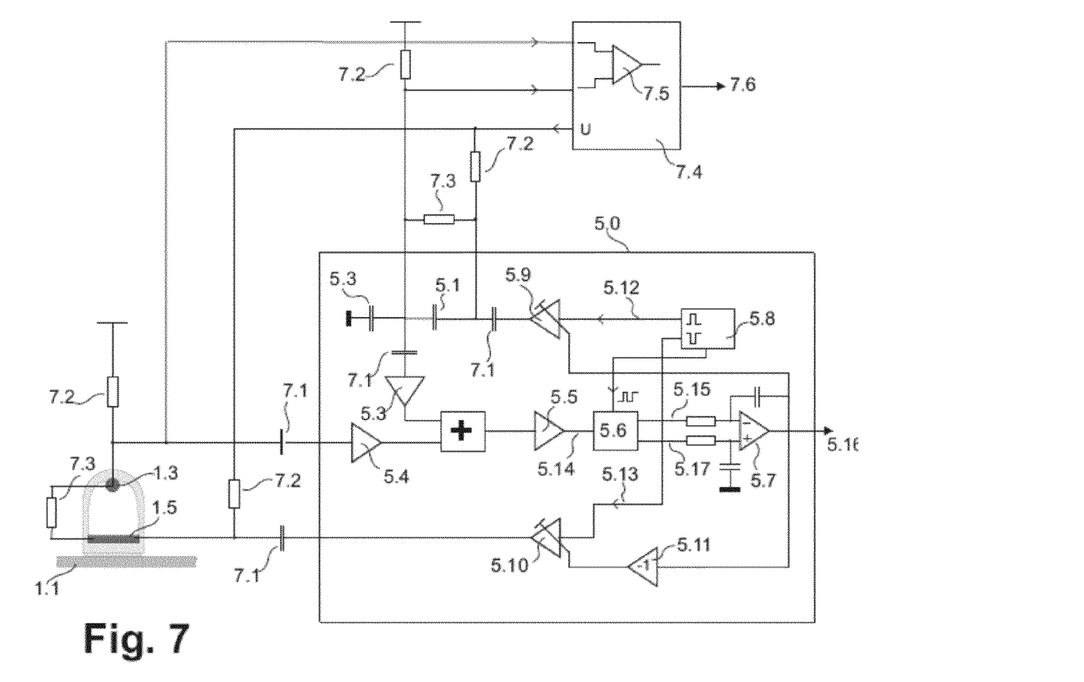
Figure 8:
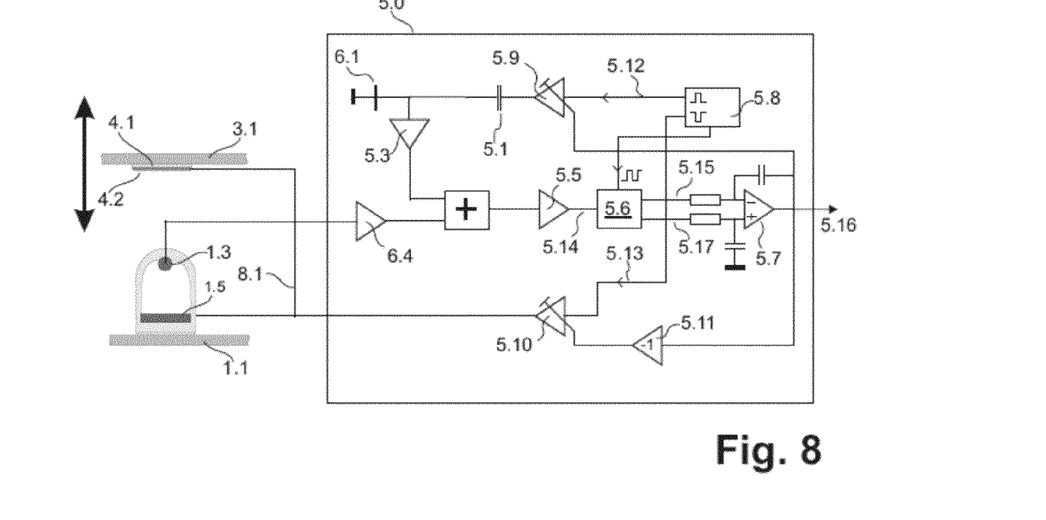

One possibility for monitoring the safety strip for mechanical damage is depicted in the exemplary embodiment of FIG. 7. The electronic evaluation system for the line monitoring unit 7.4 provides a voltage which leads to the appearance of corresponding voltages across the resistances 7.2 and 7.3 at the input of an evaluation circuit 7.5. The load resistance 7.3' is to be found at the mechanical end of the safety strip. Any interruption in the flow of current due to mechanical damage leads to a change in voltage at the input of the evaluation circuit 7.5. The same thing applies in the event that the safety strip is mechanically compressed to an extent such that the electrically conductive elements 1.5 and 1.3 touch one another. Both of these circumstances lead to the output of appropriate information 7.6 from the line monitoring unit. The condensers 7.1 only serve as blocking condensers for decoupling DC voltages.

The invention described offers yet another advantage:

In the case of a trapping prevention arrangement using the example of an automatically closing vehicle window, a window the glass of which has little capacitive effect compared with a finger is being driven towards the safety strip. Accordingly, the control value 5.16 changes by very little. The situation is different however if the trapping prevention arrangement is applied e.g. to a metallic tailgate. Closure of such a tailgate naturally leads to a large change in the capacitance especially when the distance from the metallic tailgate to the first conductive element 1.5 is small (FIG. 1). The alteration in the control value 5.16 resulting thereby can be so large that the additional change of value produced by a small child's finger touching the safety strip would be masked.

For the purposes of suppressing a change in the control value when closing the tailgate, the safety strip can be divided up into at least two portions which should preferably be attached symmetrically relative to the closing tailgate. To this end, the reference branch consisting of a series reference capacitor 5.1 and a parallel condenser 5.3 that was utilised in the exemplary embodiment of FIG. 5 is replaced by the second portion of the safety strip. Closure of the tailgate then affects both said portions to an equal extent so that only the difference needs to be measured. In the exemplary embodiment, this means a deviation of the control value towards a higher or lower value in the event of something being trapped. In the absence of a "finger", the capacitance values of both portions of the safety strip change to an equal extent when closing the tailgate so that the control value 5.16 does not change.

Figure 3:
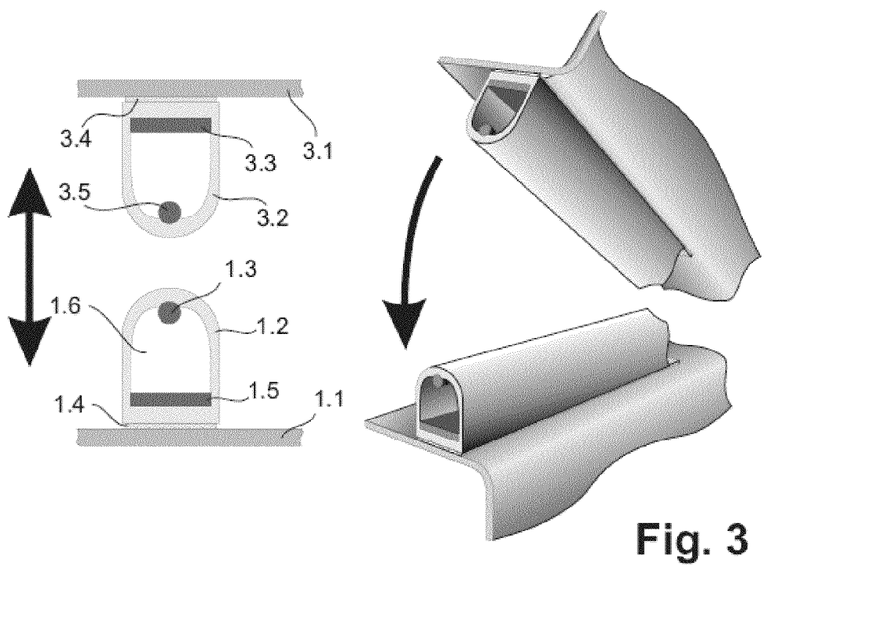

An alternative to this solution is depicted in FIG. 3. A further safety strip 3.2 is applied to the moveable element 3.1. The emitting conductive elements 1.5 and 3.3 are connected together electrically, and likewise the receiving elements 1.3 and 3.5. During the closure of the tailgate, the two safety strips approach one another. A change in the signal voltage on the conductive element 1.5 or 1.3 due to a change in the capacitance is now no longer effected for the reasons mentioned hereinbefore. It is just the mechanical compression of the safety strip that should be avoided.

Figure 4:
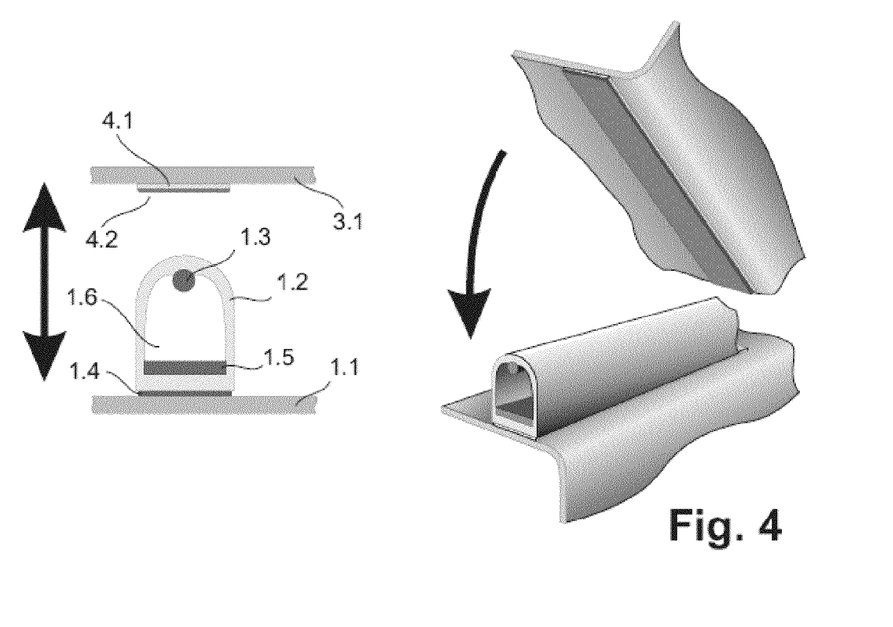

A further simplification of this circuit arrangement results in accordance with FIG. 4, if the closing tailgate, the moveable element 3.1, is provided with only one thin conductive planar element 4.2. A non conductive surface e.g. an adhesive strip 4.1, insulates the conductive planar element 4.2 with respect to the metal surface of the moveable element 3.1. The conductive element 4.2 and the first conductive element 1.5 are connected together electrically by a line 8.1. However the conductive element 4.2 can also be connected via a voltage divider to the signal for the conductive element 1.5 in order to compensate for any possible damping of the signal e.g. by the summation resistance 5.4 (FIG. 5). There is also a further possibility which consists in setting the conductive element 4.2 to the same electrical potential as the second conductive element 1.3. To this end, the signal on the second conductive element 1.3 is tapped off in high impedance manner and applied via an impedance converter to the conductive element 4.2. The crucial point here however, is that there should be no change in the control value 5.16 during the closure of the tailgate i.e. when the conductive element 4.2 is approaching the safety strip 1.2. A finger within the region of entrapment changes the capacitance of the element 1.3 with respect to the surroundings and will therefore be recognized with certainty.

Figure 14:
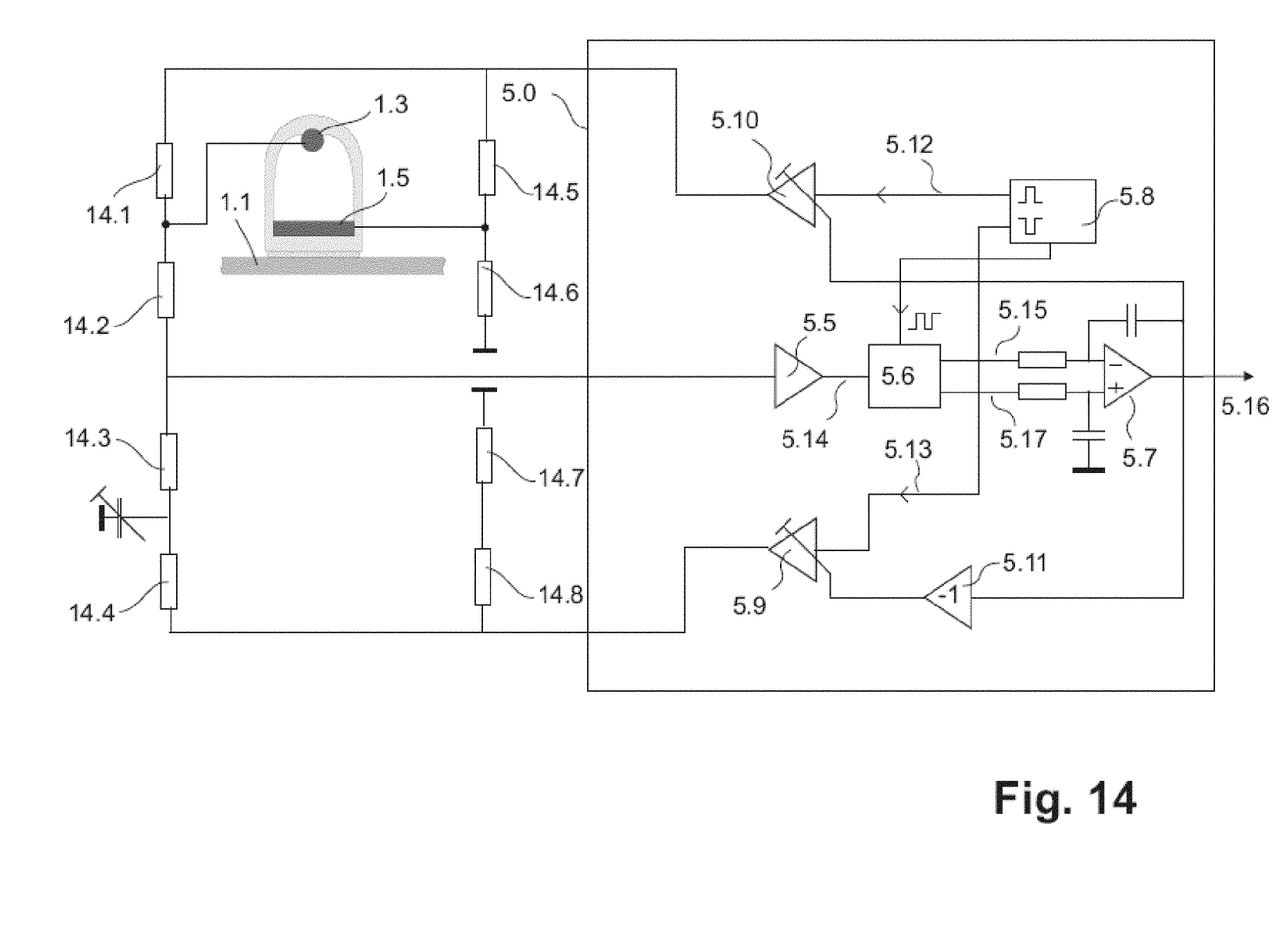

FIG. 14 illustrates a block circuit diagram, wherein the safety strip is coupled to the electronic sensor system 5.0 by means of voltage dividers. The first conductive element 1.5 is connected with the input side of the electronic sensor system 5.0 by a voltage divider constituted by the resistors 14.5, 14.6, while the second conductive element 1.3 is connected at its output side with a voltage divider constituted by the resistors 14.1, 14.2 and with the receiving end of the electronic sensor system 5.0. Resistors 14.7, 14.8 constitute on the reference side a voltage divider, which is configured analogous to the voltage divider constituted by the resistors 14.5, 14.6. Also, the resistors 14.3, 14.4 constitute a voltage divider that is analogous to the voltage divider constituted by the resistors 14.1 and 14.2. Amplitude regulators 5.9 and 5.10 control the voltage in such a way, that at the input of the alternating voltage amplifier the voltage value out of the safety strip circuit is essentially the same as the voltage value out of the reference circuit. This can also be controlled by control capacity 14.9.

The connection is effected with low impedance in the direction of the transmitter, i.e in the direction of the first conductive element 1.5, so that the resistors 14.5, 14.6 and analogous the resistors 14.7, 14.8 have for example a resistance value of 100 Ohm. At the receiving end, i.e. starting from the second conductive element 1.3 a high impedance connection is effected, so that the resistors 14.1, 14.2 and analogous at the reference side the resistors 14.3, 14.4 may have for example a resistance value of 100 KOhm.

When water droplets occur on the safety strip, a capacity arises between the water droplets and ground, i.e. to the supporting surface 1.1 and a capacity arises in the direction to the receiving side. Since the receiver is coupled to the safety strip with high impedance, a short circuit to ground cannot be perceived. Because of the high impedance capacity to the receiver the water droplets can be neglected in the measurement, especially because the voltage dividers lead to the same voltage on both sides of the safety strip. Thus, in the case of an ideal double bridge with identical drivers no capacity occurs of the water droplets. However, the approaching of an object leads to a perceivable capacity change.

Self-evidently, the arrangement described here can also be employed for rotating and sliding doors as well as in all other applications in the field of trapping prevention systems or early detection of people wherein the important factor is independence from splashes of water or moisture.

It is self-evident that this description can be subjected to the most diverse modifications, changes and adaptations which fall within the sphere of equivalents to the attached Claims

The invention claimed is:

1. A method for preventing objects or parts of a body from being trapped between at least two mutually relatively moveable parts of which at least one part has associated therewith at least one strip which comprises at least two mutually spaced conductive elements that extend in the longitudinal direction of the strip and both of which are arranged in the strip, wherein an electronic sensor system coupled to the strip is provided for producing an output signal for a capacitance the value of which is adapted to vary as a result of the presence of an object,
   wherein at least one first conductive element sends out a signal which is received by at least one second conductive element due to capacitive coupling with the first conductive element, wherein the second conductive element at substantially the same electrical potential as the first conductive element likewise sends out the received signal and is electrically connected to the electronic sensor system for the purposes of relaying a change of capacitance resulting from the presence of an object on the electronic sensor system caused by an external influence,
   the change of capacitance causing a deviation of a control value;
   evaluating the control value; and
   ceasing and/or reversing movement of the moveable parts if the control value exceeds a threshold value.

2. A method in accordance with claim 1, characterized by the arrangement of the actively driving first conductive element between a supporting surface for the strip and the second conductive element.

3. A method in accordance with claim 1, characterized by the arrangement of the second conductive element, which is capacitively coupled to the first conductive element and connected to the evaluation circuit of the electronic sensor system, at a greater distance from the supporting surface than the first conductive element.

4. A method in accordance with claim 1, wherein the generated output signal is affected by a relationship between the voltages present on the conductive elements, the relationship being variable by the presence of an object.

5. A method in accordance with claim 1, wherein the approach of an object alters the capacitance of the second conductive element relative to a reference potential.

6. A method in accordance with claim 1, wherein the second conductive element is coupled in high impedance manner to the electronic sensor system.

7. A method in accordance with claim 1, wherein the first conductive element is coupled in low impedance manner to the electronic sensor system.

8. A method in accordance with claim 1, wherein the electronic sensor system detects a geometrical change of the conductive elements relative to one another as a further output signal for the trapping prevention arrangement.

9. A method in accordance with claim 1, wherein at least one strip is arranged on each of the at least two mutually relatively moveable parts, wherein the strips are connected together electrically in parallel.

10. A method in accordance with claim 1, wherein a conductive element is arranged on at least one part of the at least two mutually relatively moveable parts, said element being insulated with respect to said one part and connected in parallel with the first conductive element.

11. A method in accordance with claim 1, wherein a clock control system feeds a clock signal to the first conductive element and superimposes a signal received by the second conductive element on an inverted clock signal in the form of an electrical signal.

12. A method in accordance with claim 11, wherein the clock control system supplies the first conductive element with the clock signal which is to be sent out thereby and then received by the second conductive element, wherein the received signal that is affected by the presence of an object and has the inverted clock signal superimposed thereon forms an input signal, and
   in that the input signal is analyzed in clocked manner in such a way that the signal which has been analyzed in clocked manner is present at the inputs of a comparator for the purposes of forming a comparative value as the control value, and
   in that at least one amplitude regulator is provided in the signal path of the clock signal and/or the inverted clock signal, said amplitude regulator utilizing the control value for the purposes of regulating the amplitude values of the clock signals in such a way that the amplitudes of the input signal which has been analyzed in clocked manner are substantially of the same size as each other so that the input signal does not contain any clock synchronous components.

13. A method in accordance with claim 1, wherein the input side of the first conductive element and the output side of the second conductive element are connected to a voltage divider.

14. A crush protection arrangement for preventing objects or parts of a body from being trapped between at least two mutually relatively moveable parts, of which at least one part has associated therewith at least one strip which comprises at least two mutually spaced conductive elements that extend in the longitudinal direction of the strip and both of which are arranged in the strip, and also an electronic sensor system coupled to the strip for producing an output signal as a result of the presence of an object,
   wherein at least one first conductive element is in the form of an emitting element for sending out a signal and in that at least one second conductive element is in the form of a receiving element due to capacitive coupling with the first conductive element, wherein the second conductive element is at substantially the same electrical potential as the first conductive element and is in the form of an emitting element which likewise sends out the received signal and is electrically connected to the electronic sensor system for the purposes of relaying a change of capacitance resulting from the presence of an object on the electronic sensor system caused by an external influence, wherein said change of capacitance causes a deviation of a control value and the control value is compared against a threshold value and if the control value exceeds the threshold value, the moveable parts cease and/or reverse movement.

15. A crush protection arrangement in accordance with claim 14, wherein the actively driving first conductive element is arranged between a supporting surface for the strip and the second conductive element.

16. A crush protection arrangement in accordance with claim 14, wherein the second conductive element, which is capacitively coupled to the first conductive element and connected to the evaluation circuit of the electronic sensor system, is located at a greater distance from the supporting surface than the first conductive element.

17. A crush protection arrangement in accordance with claim 14, wherein the output signal depends on a relationship between the voltages present on the conductive elements, the relationship being variable by the presence of an object.

18. A crush protection arrangement in accordance with claim 14, wherein the second conductive element is coupled in high impedance manner to the electronic sensor system.

19. A crush protection arrangement in accordance with claim 14, wherein the first conductive element is coupled in low impedance manner to the electronic sensor system.

20. A crush protection arrangement in accordance with claim 18, wherein the high impedance coupling is effected by means of an active impedance converter or by means of at least one of the elements consisting of a resistance and a condenser.

21. A crush protection arrangement in accordance with claim 14, wherein the electronic sensor system is formed in such a way that it detects the geometrical change of the conductive elements relative to one another as a further output signal for the crush protection arrangement.

22. A crush protection arrangement in accordance with claim 14, wherein the first conductive element is a planar element.

23. A crush protection arrangement in accordance with claim 14, wherein a strip is arranged on each of the at least two mutually relatively moveable parts, wherein the strips are connected together electrically in parallel.

24. A crush protection arrangement in accordance with claim 23, wherein the strip is divided up into at least two equal, preferably mutually symmetrically arranged parts which serve as mutual references.

25. A crush protection arrangement in accordance with claim 14, wherein a preferably planar conductive element is arranged on at least one part of the at least two mutually relatively moveable parts, said element being insulated with respect to said one part and connected electrically with substantially identical signal in parallel with the first conductive element.

26. A crush protection arrangement in accordance with claim 14, wherein there is provided a clock control system which feeds a clock signal pulse to the first conductive element and superimposes a signal received by the second conductive element on an inverted clock signal in the form of an electrical signal.

27. A crush protection arrangement in accordance with claim 26, wherein the clock control system is integrated into the electronic sensor system in such a way that the clock signal that is to be sent out thereby and received by the second conductive element is supplied to the first conductive element, wherein the received signal that is affected by the presence of an object and has the inverted clock superimposed thereon forms an input signal, and in that a synchronous demodulator for the clocked allocation of the input signal is provided in such a way that the signal which has been analyzed in clocked manner is present at the inputs of a comparator for the purposes of forming a comparison value in the form of the control value, and in that at least one amplitude regulator is provided in the signal path of the clock signal and/or the inverted clock signal, said amplitude regulator utilizing the control value for the purposes of regulating the amplitude values of the clock signals in such a way that the mutual amplitudes of the input signal which has been analyzed in clocked manner are substantially of the same size as each other so that the input signal does not contain any clock synchronous components.

28. A crush protection arrangement in accordance with claim 14, wherein the input side of the first conductive element and the output side of the second conductive element are connected to a voltage divider.

* * * * *